(12) United States Patent
Aigo et al.

(10) Patent No.: US 9,957,639 B2
(45) Date of Patent: May 1, 2018

(54) METHOD FOR PRODUCING EPITAXIAL SILICON CARBIDE WAFER

(71) Applicant: NIPPON STEEL & SUMITOMO METAL CORPORATION, Tokyo (JP)

(72) Inventors: Takashi Aigo, Tokyo (JP); Wataru Ito, Tokyo (JP); Tatsuo Fujimoto, Tokyo (JP)

(73) Assignee: NIPPON STEEL & SUMITOMO METAL CORPORATION, Tokyo (JP)

( * ) Notice: Subject to any disclaimer, the term of this patent is extended or adjusted under 35 U.S.C. 154(b) by 0 days. days.

(21) Appl. No.: 15/032,433

(22) PCT Filed: Feb. 27, 2015

(86) PCT No.: PCT/JP2015/055893
§ 371 (c)(1),
(2) Date: Apr. 27, 2016

(87) PCT Pub. No.: WO2015/129867
PCT Pub. Date: Sep. 3, 2015

(65) Prior Publication Data
US 2016/0251775 A1    Sep. 1, 2016

(30) Foreign Application Priority Data
Feb. 28, 2014 (JP) ................. 2014-038498

(51) Int. Cl.
C30B 25/20 (2006.01)
C30B 29/36 (2006.01)
(Continued)

(52) U.S. Cl.
CPC ............ *C30B 25/20* (2013.01); *C23C 16/325* (2013.01); *C23C 16/44* (2013.01); *C30B 25/08* (2013.01);
(Continued)

(58) Field of Classification Search
CPC combination set(s) only.
See application file for complete search history.

(56) References Cited

U.S. PATENT DOCUMENTS 6,306,675 B1 * 10/2001 Tsong ............... H01L 21/02378
257/E21.127
2007/0221119 A1    9/2007 Kimoto et al.
(Continued)

FOREIGN PATENT DOCUMENTS

CN          101404249 A      4/2009
EP          1 306 890 A2     5/2003
(Continued)

OTHER PUBLICATIONS

Machine translation of JP2009-218575.*
(Continued)

*Primary Examiner* — Duy Vu N Deo
*Assistant Examiner* — Erin F Bergner
(74) *Attorney, Agent, or Firm* — Birch, Stewart, Kolasch & Birch, LLP

(57) ABSTRACT

The present invention provides a method for producing an epitaxial silicon carbide wafer comprising epitaxially growing SiC on an SiC substrate to produce an epitaxial SiC wafer during which further reducing stacking faults and comet defects than the conventional technologies to obtain an epitaxial SiC wafer having a high quality epitaxial film. The method for producing the epitaxial silicon carbide wafer is characterized in that a pre-growth atmosphere gas flowing into the growth furnace before the start of epitaxial growth contains hydrogen gas and has a balance of an inert gas and unavoidable impurities, and the hydrogen gas is contained in 0.1 to 10.0 vol % with respect to the inert gas.

18 Claims, 5 Drawing Sheets

(51) Int. Cl.
*C30B 25/16* (2006.01)
*C23C 16/32* (2006.01)
*C23C 16/44* (2006.01)
*C30B 25/08* (2006.01)
*C30B 25/10* (2006.01)
*H01L 21/02* (2006.01)

(52) U.S. Cl.
CPC ............ *C30B 25/10* (2013.01); *C30B 25/165* (2013.01); *C30B 29/36* (2013.01); *H01L 21/0262* (2013.01); *H01L 21/02378* (2013.01); *H01L 21/02428* (2013.01); *H01L 21/02433* (2013.01); *H01L 21/02529* (2013.01); *H01L 21/02634* (2013.01); *H01L 21/02661* (2013.01)

(56) References Cited

U.S. PATENT DOCUMENTS

| | | | |
|---|---|---|---|
| 2009/0025641 | A1* | 1/2009 | Makarov ................ C30B 29/36 118/728 |
| 2011/0006309 | A1* | 1/2011 | Momose ............... C23C 16/325 257/77 |
| 2012/0146056 | A1* | 6/2012 | Momose ................ C30B 25/20 257/77 |
| 2013/0126906 | A1 | 5/2013 | Tomita et al. |
| 2013/0217213 | A1* | 8/2013 | Aigo ....................... C30B 25/02 438/478 |

FOREIGN PATENT DOCUMENTS

| | | | | |
|---|---|---|---|---|
| JP | 2001-77030 | A | | 3/2001 |
| JP | 2005-277229 | A | | 10/2005 |
| JP | 2005-324994 | A | | 11/2005 |
| JP | 2006-193384 | A | | 7/2006 |
| JP | 2009-218575 | * | 9/2009 | .......... H01L 21/205 |
| JP | 2009-274899 | A | | 11/2009 |
| JP | 2011-49496 | A | | 3/2011 |
| JP | 2012-246168 | A | | 12/2012 |
| JP | 2014-58411 | A | | 4/2014 |
| WO | WO 2011/142074 | A1 | | 11/2011 |
| WO | 2012/067112 | * | 5/2012 | ....... H01L 21/02378 |

OTHER PUBLICATIONS

Hidekazu Tsuchida et al.; Formation of extended defects in 4H-SiC epitaxial growth and developments of a fast growth technique; Phys. Status Solidi B 246; No. 7; pp. 1553-1568, Jun. 18, 2009.
Tatsuya Okada et al.; Crystallographic defects under device-killing surface faults in a homoepitaxially grown film of SiC; Materials Science and Engineering A361; Nov. 25, 2003; pp. 67-74.
International Search Report for PCT/JP2015/055893 dated May 19, 2015.
Written Opinion of the International Searching Authority for PCT/JP2015/055893 (PCT/ISA/237) dated May 19, 2015.
Extended European Search Report dated Dec. 6, 2017, issued in corresponding European Patent Application 15755325.6.
Hallin et al., "In situ substrate preparation for high-quality SiC chemical vapour deposition," Journal of Crystal Growth, vol. 181, 1997, pp. 241-253.

* cited by examiner

FIG. 4
(a)
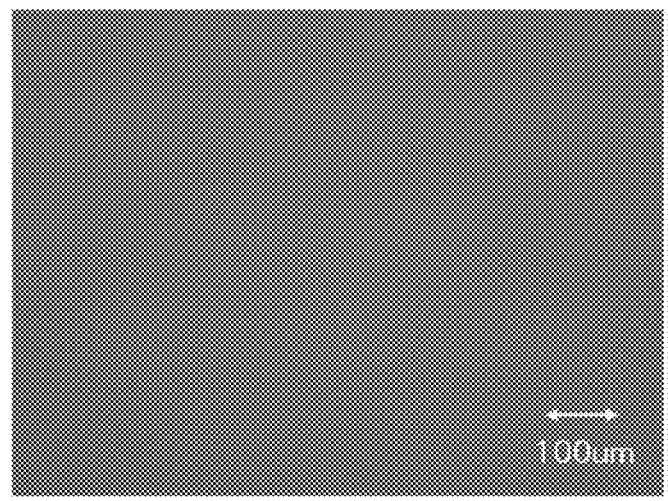
(b)
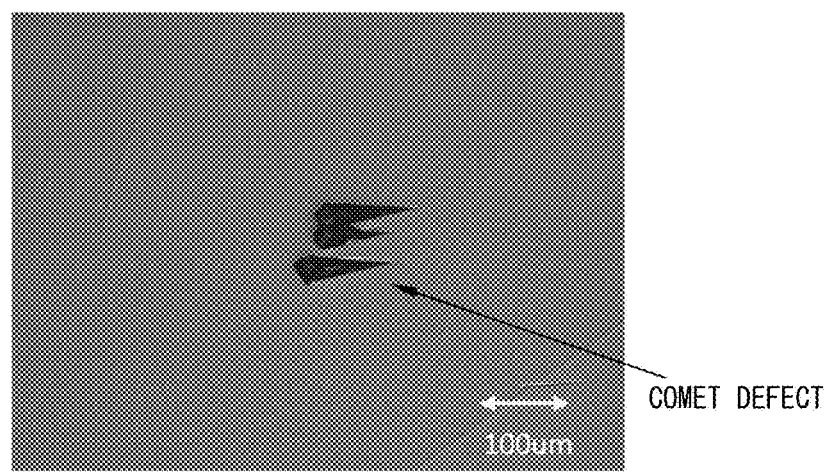
COMET DEFECT

METHOD FOR PRODUCING EPITAXIAL SILICON CARBIDE WAFER

TECHNICAL FIELD

The present invention relates to a method for producing an epitaxial silicon carbide wafer.

BACKGROUND ART

Silicon carbide (below, indicated as "SiC") is excellent in heat resistance and mechanical strength and is physically and chemically stable, so draws attention as an environmentally resistant semiconductor material. Further, in recent years, demand for epitaxial SiC wafers as substrates for high-frequency and high-voltage resistant electronic devices has been rising.

When using an SiC monocrystalline substrate (below, referred to as a "SiC substrate") to fabricate a power device, high-frequency device, etc., normally an SiC thin film is formed on the SiC substrate using the method referred to as thermal CVD (thermal chemical vapor deposition) by epitaxial growth or a dopant is directly implanted by the ion implantation method. However, in the latter case, annealing at a high temperature becomes necessary after implantation, so thin film formation by epitaxial growth is frequently used.

When growing an epitaxial film of the SiC, if there is a disturbance in crystals at the SiC substrate surface, stacking faults due to the disturbance are formed in the epitaxial film, so the epitaxial film contains normal epitaxial defects referred to as "stacking faults". The balance between the stacking faults and the epitaxial defects determines the effects on an electronic device formed on the epitaxial silicon carbide wafer, that is, the performance of the epitaxial silicon carbide wafer.

As the epitaxial defects, triangle defects, carrot defects, comet defects, etc. are known as typical defects. If these are present inside the device, they act as so-called "killer defects" degrading the device properties or performance, so reduction of these is strongly sought. At the present time, the epitaxial defects are of the level of several defects to 10 or so defects per cm$^2$, but the number of epitaxial defects contained in the device has to be substantially zero. Therefore, at the present time, a yield of production of devices having areas larger than 5 mm square or so drops sharply and it is difficult to produce these devices.

In recent years, structural analysis of triangle defects and carrot defects has been developed. The causes for the formations of these defects have been revealed (see NPLT 1). It has been learned that comet defects are formed in 3C—SiC, but the causes for the comet defects are unclear on many points (see NPLT 2). Furthermore, half or so of the epitaxial defects are comet defects. They tend to occupy greater areas than other defects, so measures which reduce the comet defects have to be quickly established. Although epitaxial SiC wafers is expected to be applied to devices in the future, in particular if not reducing the comet defects, while devices with relatively small areas can be fabricated, it is difficult to handle the large sized devices having areas of 5 mm square or so or more.

PLT 1 is characterized by raising the temperature of the SiC substrate under an argon atmosphere up to the epitaxial growth temperature to treat the substrate surface with argon under conditions of a reaction chamber to which the supply of carbon is suppressed and thereby suppress Si droplets. PLT 2 is characterized by heat treating silicon carbide substrate at 1700° C. to 2200° C. in an inert gas atmosphere or vacuum to convert the front end parts of the basal plane dislocations of the silicon carbide substrate to threading edge dislocations to thereby more reliably convert basal plane dislocations to through threading edge dislocations.

PLT 3 is characterized by polishing a 4H—SiC monocrystalline substrate slanted by a 0.4° to 5° off-angle, making the polished substrate 1400 to 1600° C. under a hydrogen atmosphere, and cleaning the surface to thereby suppress the occurrence of step bunching.

PLT 4 is characterized by annealing a silicon carbide bulk substrate with a slant angle from the <0001> plane smaller than 5° in a reducing gas atmosphere under conditions of a predetermined temperature and predetermined processing time and lowering the substrate temperature in the reducing gas atmosphere to reduce the density of carrot defects and triangle defects.

As explained above, the balance of the stacking faults and the epitaxial defects determines the performance of an epitaxial silicon carbide wafer. However, the inventions disclosed in PLTs 1 to 4 were made focusing on only suppression of triangle defects, carrot defects, and other epitaxial defects or on flatness of the SiC epitaxial film, and the inventions were insufficient in effect of reduction of stacking faults.

CITATION LIST

Patent Literature

PLT 1: Japanese Patent Publication No. 2009-274899A
PLT 2: Japanese Patent Publication No. 2012-246168A
PLT 3: Japanese Patent Publication No. 2011-49496A
PLT 4: WO2011/142074A

Nonpatent Literature

NPLT 1: H. Tsuchida et al.: Phys. Status Solidi B246, No. 7, 1553 (2009).
NPLT 2: T. Okada et al.: Materials. Science and Engineering A361, 67 (2003).

SUMMARY OF INVENTION

Technical Problem

The present invention provides a method for preparing an epitaxial SiC wafer having a high quality epitaxial film further reduced in stacking faults and comet defects compared to the conventional technologies when epitaxially growing SiC on an SiC substrate to produce an epitaxial SiC wafer.

Solution to Problem

The inventors found that one of the causes of formation of comet defects in epitaxial films in epitaxial SiC wafers is that particles of graphite flew onto the SiC substrate before epitaxial growth and the particles act as nuclei of the comet defects in the 3C—SiC. That is, when growing an SiC epitaxial film, normally, before growth, hydrogen gas is run as carrier gas to form a pressure atmosphere at the time of growth, but, for example, if the growth furnace is made of graphite, this hydrogen gas etches the graphite. The inventors believed that the graphite particles fly to the SiC substrate and become factors forming comet defects.

On the other hand, by running hydrogen as a carrier gas to etch the SiC substrate before growth, crystalline disturbance on the SiC substrate surface is removed. Due to the action of this hydrogen gas, the inventors believed stacking faults could be reduced.

Therefore, the inventors discovered that if running a slight amount of gas having an etching action like hydrogen gas before epitaxial growth and forming an atmosphere before epitaxial growth to keep down the formation of graphite particles while etching the SiC substrate surface, it is possible to reduce comet defects and stacking faults and thereby completed the present invention.

That is, the object of the present invention is achieved by the following:

(1) A method for producing an epitaxial silicon carbide wafer comprising epitaxially growing silicon carbide on a silicon carbide monocrystalline substrate in a growth furnace by thermal CVD, in which method for producing an epitaxial silicon carbide wafer, a pre-growth atmosphere gas flowing into the growth furnace before the start of epitaxial growth contains hydrogen gas and has a balance of an inert gas and unavoidable impurities, and the hydrogen gas is contained in 0.1 to 10.0 vol % with respect to the inert gas.

(2) The method for producing an epitaxial silicon carbide wafer according to (1) wherein the pre-growth atmosphere gas further contains at least one of a silane-based gas or hydrocarbon-based gas in a total of 0.1 to 1.0 vol % with respect to the inert gas.

(3) The method for producing an epitaxial silicon carbide wafer according to (1) or (2) wherein the pre-growth atmosphere gas further contains at least one type of gas of a silicon chloride-based gas, chlorinated hydrocarbon gas, and carbon tetrachloride gas in a total of 0.1 to 1.0 vol % with respect to the inert gas.

(4) The method for producing an epitaxial silicon carbide wafer according to (1) wherein the inert gas is an argon gas or helium gas.

(5) The method for producing an epitaxial silicon carbide wafer according to (2) wherein the silane-based gas is comprised of a compound expressed by $Si_xH_y$ (x, y are integers of 1 or more).

(6) The method for producing an epitaxial silicon carbide wafer according to (2) wherein the hydrocarbon-based gas is comprised of a compound expressed by $C_xH_y$ (x, y are integers of 1 or more).

(7) The method for producing an epitaxial silicon carbide wafer according to (3) wherein the silicon chloride-based gas is comprised of a compound expressed by $Si_xH_yCl_z$ (where, x, z are integers of 1 or more and y is an integer of 0 or more).

(8) The method for producing an epitaxial silicon carbide wafer according to (3) wherein the chlorinated hydrocarbon gas is comprised of a compound expressed by $C_xH_yCl_z$ (where, x, y, z are integers of 1 or more).

(9) The method for producing an epitaxial silicon carbide wafer according to any one of (1) to (8) wherein the silicon carbide monocrystalline substrate has an off-angle of an angle slanted in a <11-20> direction with respect to a (0001) plane of 4° or less.

(10) The method for producing an epitaxial silicon carbide wafer according to any one of (1) to (9) comprising epitaxially growing silicon carbon by thermal CVD of an induction heating system using a graphite growth furnace.

Advantageous Effects of Invention

According to the method for producing an epitaxial SiC wafer of the present invention, it is possible to reduce the comet defects and other epitaxial defects and stacking faults in the epitaxial film more than the conventional technologies and provide an epitaxial SiC wafer having a high quality epitaxial film.

Further, in the method of for producing the present invention, thermal CVD is used to form an epitaxial film, so the hardware configuration is simple, controllability is also excellent, and an epitaxial SiC wafer high in uniformity and reproducibility can be obtained.

Furthermore, a device using an epitaxial SiC wafer obtained by the present invention is formed on a high quality epitaxial film reduced in comet defects, so the characteristics and the yield of production of the device are improved.

BRIEF DESCRIPTION OF DRAWINGS

FIG. 4A is an optical micrograph showing surface conditions of an epitaxial silicon carbide wafer produced by one method of the present invention, while FIG. 4B is an optical micrograph showing surface conditions of an epitaxial silicon carbide wafer produced using pre-growth atmosphere gas not satisfying the production conditions of the present invention.

DESCRIPTION OF EMBODIMENTS

Below, specific details of the present invention will be explained.

First, epitaxial growth on an SiC substrate will be explained.

The apparatus suitably used for the epitaxial growth in the present invention is a horizontal type CVD apparatus. CVD features a simple hardware configuration and the ability to control the film thickness of epitaxial growth by turning the gas on/off, so is a method of growth excellent in controllability and reproducibility of the epitaxial film. In particular, the present invention is more suitably applied when epitaxially growing silicon carbide by thermal CVD of an induction heating system provided with a graphite growth furnace.

Figure 5:
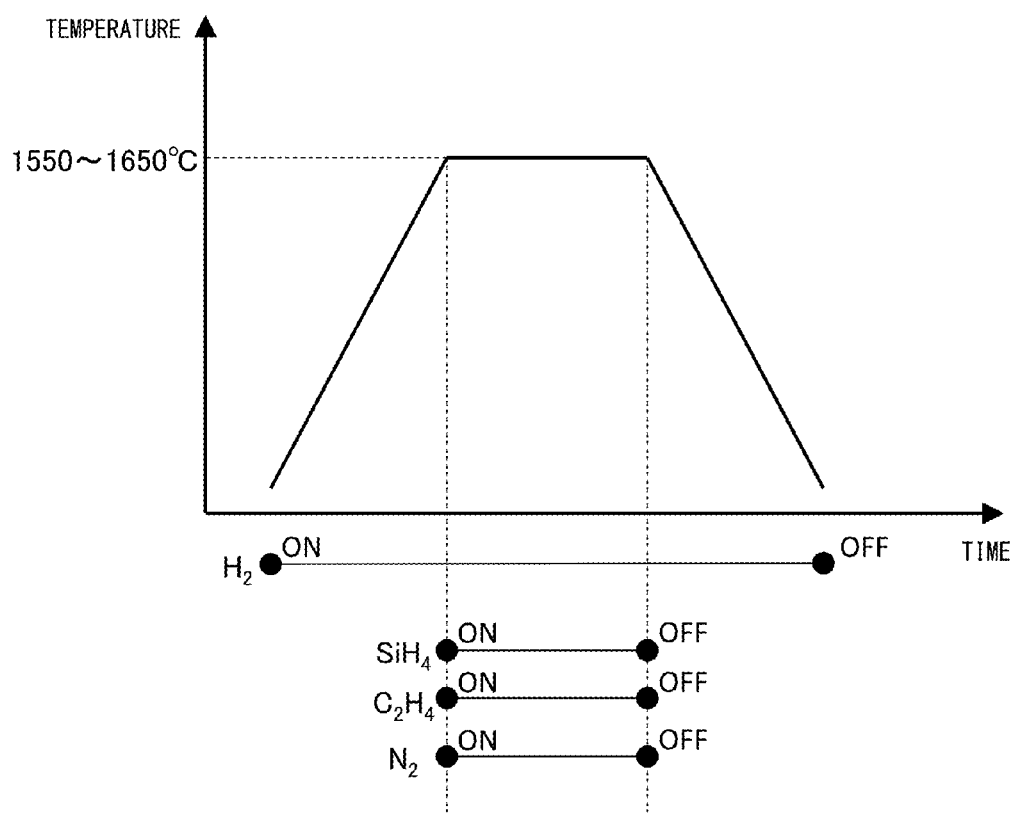
FIG. 5 is a view showing a typical growth sequence when performing conventional epitaxial growth.

FIG. 5 shows a growth sequence by typical CVD when performing conventional epitaxial film growth along with the timing of introduction of gas. First, an SiC substrate is set in a growth furnace, the inside of the growth furnace is evacuated, then hydrogen gas (carrier gas) is introduced to adjust the pressure to $1 \times 10^4$ to $3 \times 10^4$ Pa. After that, the pressure is held constant while raising the temperature of the growth furnace. After reaching the growth temperature 1550 to 1650° C., the raw material gases $SiH_4$ and $C_2H_4$ and doping gas $N_2$ are introduced and growth is started. The flow rate of the silicon-based raw material gas $SiH_4$ at this time is 40 to 50 cm³ per minute, the flow rate of the carbon-based raw material gas $C_2H_4$ is 20 to 40 cm³ per minute (C/Si ratio is about 0.8 to 2.0), and the growth rate is 6 to 7 μm per hour. This growth rate is determined considering productivity since the thickness of the epitaxial layer usually used is 10 μm or so. At the point of time when a desired film thickness is obtained, the introduction of $SiH_4$, $C_2H_4$, and $N_2$ is stopped and the temperature is lowered in the state running only hydrogen gas. After the temperature falls to ordinary temperature, the introduction of hydrogen gas is stopped, the inside of the growth chamber is evacuated, inert gas is introduced into the growth chamber, the growth chamber is returned to atmospheric pressure, then the SiC substrate is taken out.

First Embodiment

Figure 1:
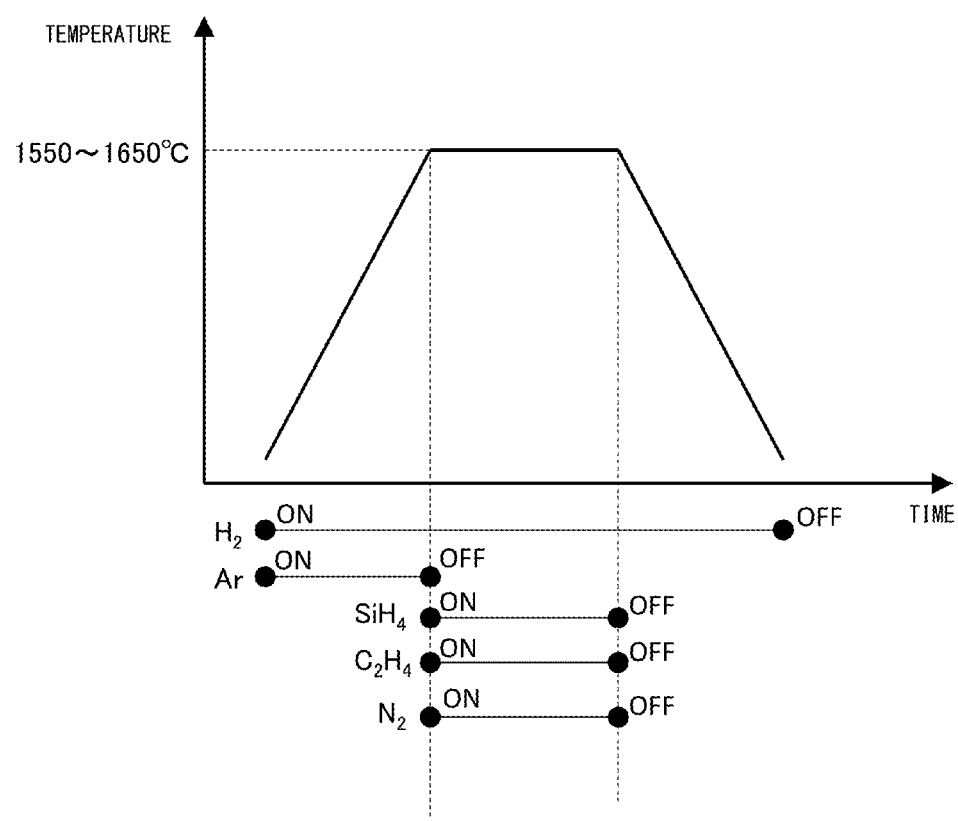
FIG. 1 is a view showing a growth sequence when performing epitaxial growth according to a first embodiment of the present invention.

Next, one embodiment of the growth sequence when growing an epitaxial film according to the present invention will be shown in FIG. 1. An SiC substrate is set to the growth furnace, the inside of the growth furnace is evacuated, then pre-growth atmosphere gas comprised of inert gas (in FIG. 1, argon gas) and hydrogen gas is introduced to adjust the pressure to $1\times10^4$ to $3\times10^4$ Pa. The flow rate of the hydrogen gas is adjusted so that the concentration of hydrogen gas in the pre-growth atmosphere gas becomes 0.1 to 10.0 vol % with respect to the inert gas.

After this, the pressure is held constant while the temperature of the growth furnace is raised. After reaching the growth temperature 1550 to 1650° C., the introduction of argon gas is stopped. Simultaneously, if necessary, the flow rate of the hydrogen gas (carrier gas) is adjusted, then the raw material gases $SiH_4$ and $C_2H_4$ and the doping gas $N_2$ are introduced to start the growth. The subsequent process is similar to the conventional method. By not running a large amount of hydrogen gas until just before growth, it is possible to prevent etching of the graphite member forming the growth furnace and suppress the formation of graphite particles flying onto the pre-growth substrate, so it is possible to reduce comet defects at the finished grown epitaxial film surface.

In the conventional technologies, the SiC substrate surface has marks and a damaged surface layer due to polishing etc. These cause epitaxial defects, so it was necessary to etch the SiC substrate to a certain extent in the growth furnace before epitaxial growth. On the other hand, for the CVD carrier gas, since there is little natural convection and the rate of diffusion of the raw material gas is large, hydrogen gas is frequently used, but hydrogen gas also has etchability with respect to SiC, so it has more preferably been used for the CVD of SiC. The above-mentioned pre-growth etching of SiC substrate is in general performed while the temperature inside the growth furnace is reaching the growth temperature and by taking a certain amount of time after the growth temperature is reached. However, even if a damage-free surface is obtained due to this, as explained in detail, graphite particles are generated by etching of the graphite member by the hydrogen gas, so formation of comet defects due to this has not been able to be suppressed.

On the other hand, if using for the carrier gas only an inert gas like argon gas as a pre-growth atmosphere gas, the problem of etching of the graphite member is reduced, but marks or a damaged surface layer on the SiC substrate surface are not sufficiently removed and stacking faults are liable to increase.

Therefore, in the present invention, to impart some etchability, pre-growth atmosphere gas containing hydrogen gas in 0.1 to 10 vol % with respect to the inert gas and mainly comprising an inert gas is run inside the growth furnace until right before the start of epitaxial growth.

For example, as shown in the sequence shown in FIG. 1, pre-growth atmosphere gas containing hydrogen gas in 0.1 to 10 vol % with respect to the argon gas is run inside the growth furnace. By running such a pre-growth atmosphere gas, the same pressure condition as the time of epitaxial growth can be made and the gas in the growth furnace can be changed from a pre-growth atmosphere gas to the growth atmosphere gas so as to start the epitaxial growth. Further, the "growth atmosphere gas" is the gas containing raw material gas or doping gas ($N_2$) introduced into the growth furnace together with the hydrogen gas. The gas comprised of these components will be called the "growth atmosphere gas".

The pre-growth atmosphere gas flowing up until right before epitaxial growth, as mentioned above, is one mainly comprised of an inert gas. As the inert gas, helium, neon, argon, krypton, xenon, radon, or another rare gas is suitable. More preferably, it is argon gas or helium gas. Nitrogen gas is also an inert gas, but acts as a doping gas for SiC. If running it until right before growth, when starting the growth, control of the doping density becomes unstable, so this is unsuitable.

Note that, as the inert gas, for example, use of a mixed gas of argon gas and helium gas may be considered, but these gases are used for the purpose of preventing etching of the graphite member, so the two do not have to be mixed.

Further, the SiC substrate for growing the epitaxial film is preferably one having an off-angle in the <11-20> direction with respect to the (0001) plane. The larger this angle, the higher the density of steps appearing at the surface, so so-called step-flow growth easily occurs and an epitaxial film with few defects is obtained. However, if the off-angle becomes larger, the yield from an ingot falls, the basal plane dislocation density becomes greater, and other problems occur, so the off-angle has to be reduced. The current mainstream is 4° or less. The present invention can be applied even to epitaxial growth on an SiC substrate having an off-angle of 4° or less since the magnitude of the off-angle is not directly relevant to the present invention. As a result, it is possible to obtain a high quality epitaxial SiC wafer with few comet defects and other such epitaxial defects.

Second Embodiment

Furthermore, when evaporation of the silicon atoms or carbon atoms from the pre-growth SiC substrate surface would become a problem, the pre-growth atmosphere gas may contain at least one of a silane-based gas or hydrocarbon-based gas (below, referred to as "raw material gas").

In this case, if the raw material gas is too great, the surface conditions will become unstable, so the flow rate of the raw material gas is, in terms of the ratio with the flow rate of the inert gas, 0.1 vol % to 1.0 vol % of either or a total of both of a silane-based or hydrocarbon-based raw material gas.

Further, the silane-based gas may also be a gas comprised of a compound expressed by $Si_xH_y$ (x, y are integers of 1 or more).

Further, the hydrocarbon-based gas may also be a gas comprised of a compound expressed by $C_xH_y$ (x, y are integers of 1 or more).

Figure 2:
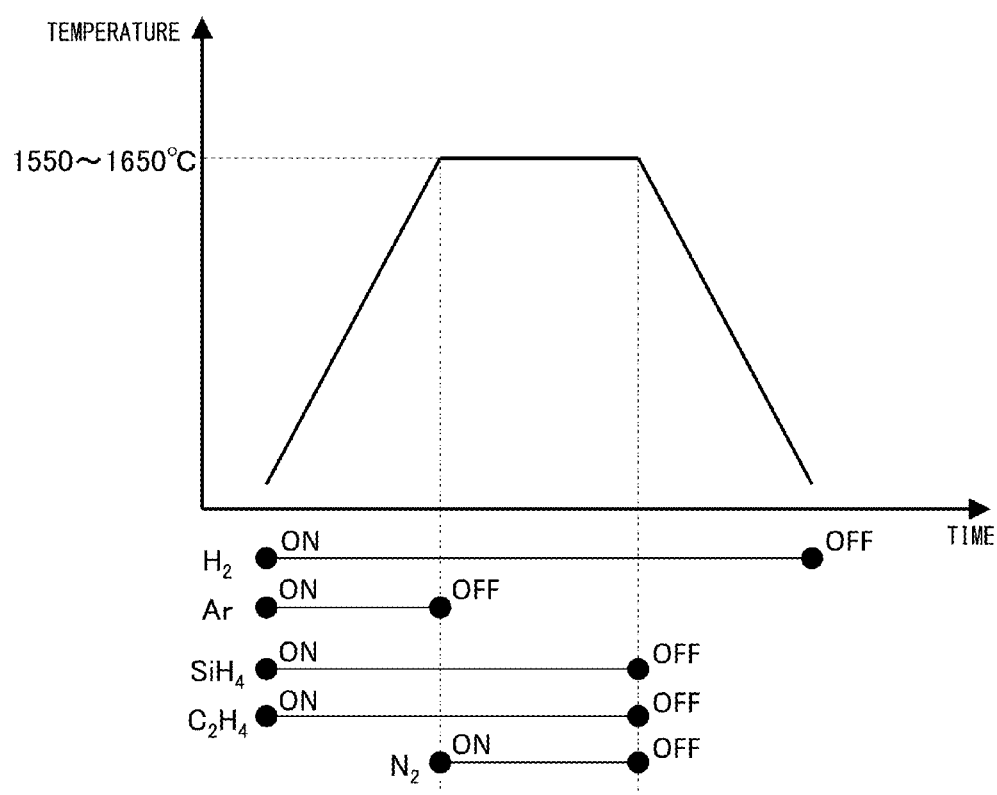
FIG. 2 is a view showing a growth sequence when performing epitaxial growth according to a second embodiment of the present invention.

The growth sequence of the second embodiment is shown in FIG. 2. FIG. 2 shows the growth sequence in the case of using a silane-based gas comprised of $SiH_4$ gas and using a hydrocarbon-based gas comprised of $C_2H_4$ gas.

Third Embodiment

Further, to raise the etchability of the SiC substrate surface to reduce the stacking faults, the pre-growth atmosphere gas may further contain at least one of silicon chloride-based gas, chlorinated hydrocarbon gas, and carbon tetrachloride gas in a total of 0.1 to 1.0 vol % with respect to the inert gas.

Further, the silicon chloride-based gas may also be a gas comprised of a compound expressed by $Si_xH_yCl_z$ (where, x, z are integers of 1 or more and y is an integer of 0 or more).

Figure 3:
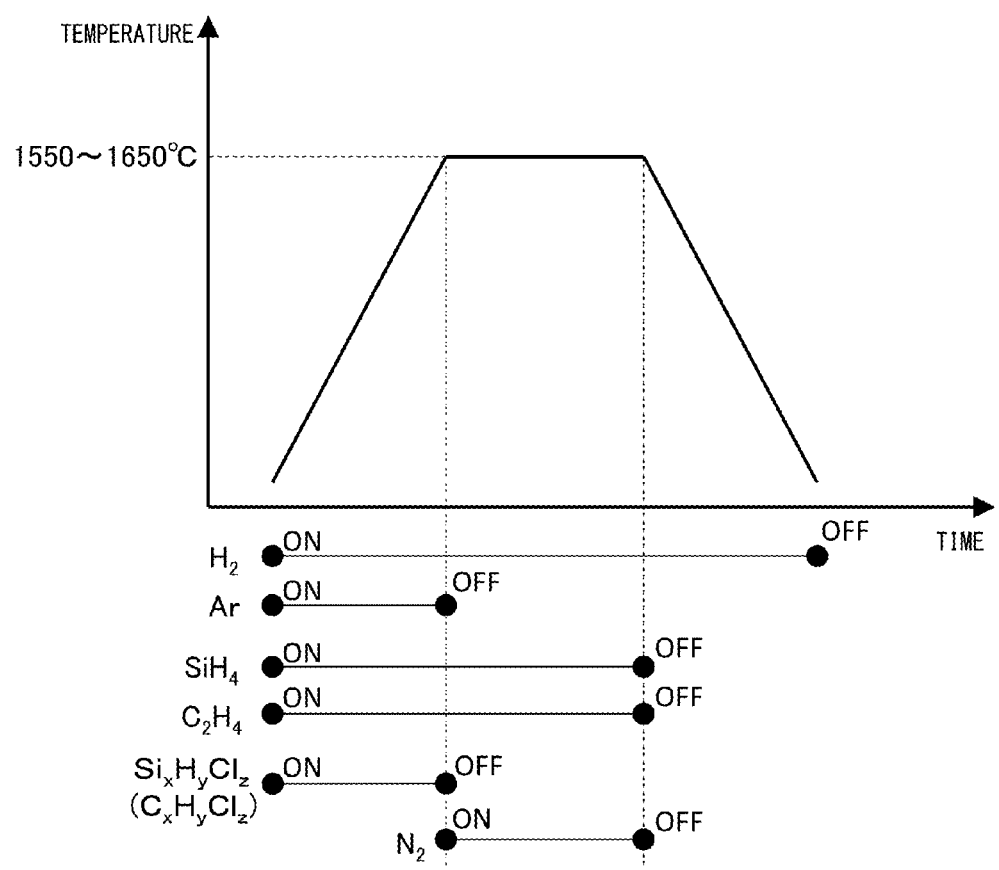
FIG. 3 is a view showing a growth sequence when performing epitaxial growth according to a third embodiment of the present invention.

The growth sequence of the third embodiment is shown in FIG. 3. FIG. 3 shows the growth sequence in the case of using a silane-based gas comprised of $SiH_4$ gas, using a hydrocarbon-based gas comprised of $C_2H_4$ gas, and further using at least one type of a silicon chloride-based gas, chlorinated hydrocarbon gas, and carbon tetrachloride gas.

As the device suitably formed on the epitaxial SiC wafer on which the epitaxial film is grown in this way, for example, a Schottky barrier diode, PIN diode, MOS diode, MOS transistor, etc. may be mentioned, but the invention is not limited to these. In particular, the invention is suitable for obtaining a device used for power control.

EXAMPLES

Below, examples will be used to explain the present invention, but the present invention is not limited to these in content.

Invention Examples

Sample Nos. 1 to 81

Preparation of SiC Monocrystalline Substrate

A 4 inch (100 mm) wafer SiC monocrystalline ingot was sliced by an approximately 400 μm thickness, then polished normally by lapping and a diamond abrasive to prepare a SiC monocrystalline substrate. The polytype of the SiC monocrystalline substrate was 4H, the plane direction was the (0001) Si plane, and the off-angle of the substrate was 4° (off direction was <11-20> direction, same below unless otherwise indicated). If perform polishing in this way, the thickness of the damaged surface layer at the surface became not more than several hundred nm or so. After this, as the finishing polishing, CMP was performed, but a polishing slurry including silica and other polisher particles and an acid was used, the pressing force and slurry pH were suitably adjusted, the polishing rate was adjusted to 50 to 100 nm/hr or so, then CMP was performed for a polishing time so as to be able to remove the damaged surface layer and prevent the polishing marks from remaining. Due to this, a surface roughness Ra of 0.1 nm or less and a state could be obtained where the atomic steps appeared, that is, the damaged surface layer of the surface was removed.

The above such prepared SiC monocrystalline substrate was used to produce the silicon carbide wafers of Sample Nos. 1 to 81 of the invention examples by the following methods of manufacturing.

Procedure of Epitaxial Growth

An SiC monocrystalline substrate was set in a graphite growth furnace forming part of an induction heating type thermal CVD apparatus, the inside of the growth furnace was evacuated, then pre-growth atmosphere gas of the components shown in Table 1 to Table 4 were introduced while adjusting the pressure to $1.0 \times 10^4$ Pa. After this, the pressure was held constant while raising the temperature of the growth furnace to 1600° C. When the temperature stabilized, the inert gas, $SiCl_4$, and $CCl_4$ gas contained in the pre-growth atmosphere gas were stopped and simultaneously hydrogen gas (carrier gas) at 150 liters per minute, the $SiH_4$ gas at the flow rate of 40 cm³ per minute, and the $C_2H_4$ gas at the flow rate of 20 cm³ per minute were introduced into the growth furnace to start the growth. The SiC epitaxial film was grown to a thickness of 10 μm, then the introduction of $SiH_4$ and $C_2H_4$ was stopped and the temperature was lowered in the state running only hydrogen gas. After the temperature was lowered to ordinary temperature, the introduction of hydrogen gas was stopped, the inside of the growth chamber was evacuated, and inert gas was introduced into the growth chamber to return the growth chamber to atmospheric pressure, then the substrate was taken out.

The measurement results of the defect densities of the silicon carbide wafers of the sample numbers of the invention examples are shown in Table 1 to Table 4. As shown in Table 1 to Table 4, the invention examples with compositions of pre-growth atmosphere gas satisfying the conditions of the method of production according to the present invention in each case had less than four epitaxial defects, two or less comet defects, and three or less stacking faults.

Note that, these defect densities are generally measured by using a differential interference contrast type microscope to examine the wafer surface in the diametrical direction (vertical and horizontal) by a power of X100, counting the numbers of the defects, and dividing the numbers by the observed area to obtain numbers per 1 cm². Further, the stacked fault density is shown as the number of defects per 1 cm² which emit light at wavelengths of about 420 nm and 460 nm by photoluminescence.

An optical micrograph of the surface of the silicon carbide wafer of Sample No. 33 of the invention example is shown in FIG. 4A. From FIG. 4A, it will be understood that a good film with little surface roughness or defects is obtained.

Comparative Examples

Sample Nos. 82 to 94

SiC was epitaxially grown on the Si plane of a 4 inch (100 mm) SiC monocrystalline substrate having a 4H type polytype which was sliced, roughly ground, normally polished and finish polished in the same way as the invention examples. The plane direction of the SiC monocrystalline substrate was the (0001) Si plane, while the off-angle was 4°. The polished state of the substrate was similar to Sample Nos. 1 to 81 of the invention examples. When producing the silicon carbide wafers of the comparative examples, except for Sample No. 84, inert gas was introduced under conditions similar to the invention examples while the pressure was adjusted to $1.0 \times 10^4$ Pa. The subsequent procedure, gas flow rate, temperature, etc. were similar to Example 1, while the grown thickness was 10 μm.

As the procedure of epitaxial growth of the silicon carbide wafer of Sample No. 84, a substrate was set in a graphite growth furnace, the inside of the growth furnace was evacuated, then, not using inert gas, only hydrogen gas was introduced at 150 liters per minute while adjusting the pressure to $1.0 \times 10^4$ Pa. The subsequent procedure, gas flow rate, temperature, etc. were similar to Example 1. The grown thickness was 10 μm.

The epitaxial film of Sample No. 84 had a large epitaxial defect density of 9/cm² and a comet defect density of 6/cm². Even at the substrate from which marks and the damaged surface layer were removed, an increase was seen in defects due to graphite particles which were generated by the etching by hydrogen gas and flew to the pre-growth substrate surface.

Sample Nos. 82, 83, 86, 87, and 89 to 94 are silicon carbide wafers produced using a pre-growth atmosphere gas not containing hydrogen. Compared with Sample Nos. 84, 85, and 88 produced using the pre-growth atmosphere gas containing hydrogen, Sample Nos. 82, 83, 86, 87, and 89 to 94 clearly increased in defect density of stacking faults.

On the other hand, Sample No. 85 is a silicon carbide wafer produced using a pre-growth atmosphere gas containing hydrogen gas, but had a large epitaxial defect density of 6.5/cm² and comet defect density of 4/cm². FIG. 4B is an optical micrograph of the surface of the silicon carbide wafer of Sample No. 85. Comet defects are formed on its surface. In this way, Sample No. 85 showed the effect of etching of the graphite member due to the large ratio of hydrogen gas in the pre-growth atmosphere gas used.

Further, Sample No. 86 had a large epitaxial defect density of 7.8/cm² and comet defect density of 4.5/cm². Due to a large ratio of SiH₄ gas, Si droplets etc. were formed on the substrate and thereby defects were influenced to increase as an effect.

Sample No. 87 had a large epitaxial defect density of 8.5/cm² and comet defect density of 4/cm² and a large ratio of C₂H₄ gas, so the surface conditions of the substrate became unstable and thereby defects were influenced to increase as an effect.

In Sample Nos. 82, 85 to 87, 91, and 92, as inert gas, argon gas was used. On the other hand, in Sample Nos. 83, 88 to 90, 93, and 94, instead of argon gas, helium gas was used. The other conditions were made similar to the invention examples for epitaxial growth. The epitaxial growth film of Sample No. 88 had an epitaxial defect density of 7/cm² and a comet defect density of 5.5/cm², the epitaxial growth film of Sample No. 89 had an epitaxial defect density of 8.8/cm² and a comet defect density of 5.8/cm², and the epitaxial growth film of Sample No. 90 had an epitaxial defect density of 8.5/cm² and a comet defect density of 4.3/cm².

In the above embodiments, as the pre-growth atmosphere gas, a mixed gas of argon gas or helium gas and hydrogen gas and a mixed gas of argon gas or helium gas, hydrogen gas and the raw material gas were run before growth, respectively. At the time of epitaxial growth, these pre-growth atmosphere gases were stopped and simultaneously hydrogen gas (carrier gas) and raw material gases were run to start the growth. However, it is also possible to gradually stop and introduce these gases. Further, the raw material gas used need not be only $SiH_4$ gas and $C_2H_4$ gas, but also a silicon-based raw material gas such as $Si_2H_6$ or chlorosilane gas or a carbon-based raw material gas such as $C_3H_8$ etc can be used. Further, as doping gas, $N_2$ gas may be simultaneously run with the raw material gas while performing growth.

TABLE 1

| | | Pre-growth atmosphere gas components | | | | | | | | Defect density (/cm²) | | |
|---|---|---|---|---|---|---|---|---|---|---|---|---|
| | | Inert gas (A) | | Hydro- | Material gas (Si) | | Material gas (C) | | | | | |
| | | Argon | Helium | gen (B) | $SiH_4$ | $SiCl_4$ | $C_2H_4$ | $CCl_4$ | | | | |
| Sample no. | Inv. ex./ Comp. ex. | (liter/min) | (liter/min) | (liter/min) | (liter/min) | (liter/min) | (liter/min) | (liter/min) | B/A (vol %) | (Si + C)/A (vol %) | Epitaxial defects | Comet defects | Stacking faults |
| 1 | Inv. ex. | | 50 | 0.5 | | | | | 1 | 0.0 | 2.3 | 1.2 | 3 |
| 2 | Inv. ex. | 50 | | 5 | | | | | 10 | 0.0 | 2.5 | 1.2 | 2.1 |
| 3 | Inv. ex. | 50 | | 0.5 | | | | | 1 | 0.0 | 2.2 | 1 | 2.9 |
| 4 | Inv. ex. | | 50 | 5 | | | | | 10 | 0.0 | 2.5 | 1.5 | 2.2 |
| 5 | Inv. ex. | 50 | | 5 | 0.05 | | | | 10 | 0.1 | 2.4 | 1.4 | 1.1 |
| 6 | Inv. ex. | 50 | | 5 | 0.25 | | | | 10 | 0.5 | 2.5 | 1.4 | 0.9 |
| 7 | Inv. ex. | 50 | | 5 | 0.5 | | | | 10 | 1.0 | 2.6 | 1.5 | 0.8 |
| 8 | Inv. ex. | 50 | | 5 | | | | 0.05 | 10 | 0.1 | 2.7 | 1.5 | 1 |
| 9 | Inv. ex. | 50 | | 5 | | | | 0.25 | 10 | 0.5 | 2.8 | 1.6 | 0.9 |
| 10 | Inv. ex. | 50 | | 5 | | | | 0.5 | 10 | 1.0 | 3 | 1.6 | 1 |
| 11 | Inv. ex. | 50 | | 2.5 | | | | 0.05 | 5 | 0.1 | 2.6 | 1.4 | 1.2 |
| 12 | Inv. ex. | 50 | | 2.5 | | | | 0.25 | 5 | 0.5 | 2.6 | 1.4 | 1.2 |
| 13 | Inv. ex. | 50 | | 2.5 | | | | 0.5 | 5 | 1.0 | 2.9 | 1.5 | 1.1 |
| 14 | Inv. ex. | 50 | | 0.5 | | | | 0.05 | 1 | 0.1 | 2.2 | 1.4 | 1.4 |
| 15 | Inv. ex. | 50 | | 0.5 | | | | 0.25 | 1 | 0.5 | 2.4 | 1.3 | 1.3 |
| 16 | Inv. ex. | 50 | | 0.5 | | | | 0.5 | 1 | 1.0 | 2.5 | 1.3 | 1.3 |
| 17 | Inv. ex. | | 50 | 5 | 0.05 | | | | 10 | 0.1 | 3.3 | 1.6 | 1.1 |
| 18 | Inv. ex. | | 50 | 5 | 0.25 | | | | 10 | 0.5 | 3.1 | 1.6 | 1.1 |
| 19 | Inv. ex. | | 50 | 5 | 0.5 | | | | 10 | 1.0 | 3.1 | 1.5 | 1 |
| 20 | Inv. ex. | | 50 | 2.5 | 0.05 | | | | 5 | 0.1 | 2.7 | 1.3 | 1.4 |
| 21 | Inv. ex. | | 50 | 2.5 | 0.25 | | | | 5 | 0.5 | 2.9 | 1.4 | 1.2 |
| 22 | Inv. ex. | | 50 | 2.5 | 0.5 | | | | 5 | 1.0 | 3 | 1.5 | 1.3 |
| 23 | Inv. ex. | | 50 | 0.5 | 0.05 | | | | 1 | 0.1 | 2.6 | 1.2 | 1.5 |
| 24 | Inv. ex. | | 50 | 0.5 | 0.25 | | | | 1 | 0.5 | 2.8 | 1.3 | 1.4 |
| 25 | Inv. ex. | | 50 | 0.5 | 0.5 | | | | 1 | 1.0 | 2.7 | 1.3 | 1.4 |

TABLE 2

| | | Pre-growth atmosphere gas components | | | | | | | | Defect density (/cm²) | | |
|---|---|---|---|---|---|---|---|---|---|---|---|---|
| | | Inert gas (A) | | Hydro- | Material gas (Si) | | Material gas (C) | | | | | |
| | | Argon | Helium | gen (B) | $SiH_4$ | $SiCl_4$ | $C_2H_4$ | $CCl_4$ | | | | |
| Sample no. | Inv. ex./ Comp. ex. | (liter/min) | (liter/min) | (liter/min) | (liter/min) | (liter/min) | (liter/min) | (liter/min) | B/A (vol %) | (Si + C)/A (vol %) | Epitaxial defects | Comet defects | Stacking faults |
| 26 | Inv. ex. | | 50 | 5 | | | 0.05 | | 10 | 0.1 | 3.1 | 1.7 | 1.3 |
| 27 | Inv. ex. | | 50 | 5 | | | 0.25 | | 10 | 0.5 | 3 | 1.6 | 1.2 |
| 28 | Inv. ex. | | 50 | 5 | | | 0.5 | | 10 | 1.0 | 3.1 | 1.6 | 1.2 |

TABLE 2-continued

| | | Pre-growth atmosphere gas components | | | | | | | | | | |
|---|---|---|---|---|---|---|---|---|---|---|---|---|
| | | Inert gas (A) | | Hydro- | Material gas (Si) | | Material gas (C) | | | | Defect density (/cm$^2$) | | |
| | | Argon | Helium | gen (B) | SiH$_4$ | SiCl$_4$ | C$_2$H$_4$ | CCl$_4$ | | | | | |
| Sample no. | Inv. ex./ Comp. ex. | (liter/ min) | (liter/ min) | (liter/ min) | (liter/ min) | (liter/ min) | (liter/ min) | (liter/ min) | B/A (vol %) | (Si + C)/A (vol %) | Epitaxial defects | Comet defects | Stacking faults |
| 29 | Inv. ex. | | 50 | 2.5 | | | 0.05 | | 5 | 0.1 | 2.7 | 1.8 | 1.4 |
| 30 | Inv. ex. | | 50 | 2.5 | | | 0.25 | | 5 | 0.5 | 3 | 1.7 | 1.4 |
| 31 | Inv. ex. | | 50 | 2.5 | | | 0.5 | | 5 | 1.0 | 3.2 | 1.8 | 1.3 |
| 32 | Inv. ex. | 50 | | 2.5 | 0.05 | | | | 5 | 0.1 | 2.6 | 1.1 | 1.5 |
| 33 | Inv. ex. | 50 | | 2.5 | 0.25 | | | | 5 | 0.5 | 2.7 | 1.3 | 1.3 |
| 34 | Inv. ex. | 50 | | 2.5 | 0.5 | | | | 5 | 1.0 | 2.5 | 1.2 | 1.1 |
| 35 | Inv. ex. | | 50 | 0.5 | | | 0.05 | | 1 | 0.1 | 2 | 1.2 | 1.6 |
| 36 | Inv. ex. | | 50 | 0.5 | | | 0.25 | | 1 | 0.5 | 2.3 | 1.2 | 1.5 |
| 37 | Inv. ex. | | 50 | 0.5 | | | 0.5 | | 1 | 1.0 | 2.6 | 1.4 | 1.6 |
| 38 | Inv. ex. | | 50 | 5 | | 0.05 | | | 10 | 0.1 | 3.4 | 1.7 | 1.4 |
| 39 | Inv. ex. | | 50 | 5 | | 0.25 | | | 10 | 0.5 | 3.4 | 1.8 | 1.2 |
| 40 | Inv. ex. | | 50 | 5 | | 0.5 | | | 10 | 1.0 | 3.5 | 1.8 | 1.2 |
| 41 | Inv. ex. | | 50 | 2.5 | | 0.05 | | | 5 | 0.1 | 3 | 1.7 | 1.6 |
| 42 | Inv. ex. | | 50 | 2.5 | | 0.25 | | | 5 | 0.5 | 3.3 | 1.5 | 1.4 |
| 43 | Inv. ex. | | 50 | 2.5 | | 0.5 | | | 5 | 1.0 | 3.3 | 1.6 | 1.3 |
| 44 | Inv. ex. | | 50 | 0.5 | | 0.05 | | | 1 | 0.1 | 2.5 | 1.3 | 1.6 |
| 45 | Inv. ex. | | 50 | 0.5 | | 0.25 | | | 1 | 0.5 | 2.6 | 1.3 | 1.6 |
| 46 | Inv. ex. | | 50 | 0.5 | | 0.5 | | | 1 | 1.0 | 2.8 | 1.4 | 1.5 |
| 47 | Inv. ex. | | 50 | 5 | | | | 0.05 | 10 | 0.1 | 3.7 | 1.9 | 1 |
| 48 | Inv. ex. | | 50 | 5 | | | | 0.25 | 10 | 0.5 | 3.6 | 1.8 | 1.2 |
| 49 | Inv. ex. | | 50 | 5 | | | | 0.5 | 10 | 1.0 | 3.8 | 2 | 1.1 |
| 50 | Inv. ex. | | 50 | 2.5 | | | | 0.05 | 5 | 0.1 | 3.4 | 1.5 | 1.4 |

TABLE 3

| | | Pre-growth atmosphere gas components | | | | | | | | | | |
|---|---|---|---|---|---|---|---|---|---|---|---|---|
| | | inert gas (A) | | Hydro- | Material gas (Si) | | Material gas (C) | | | | Defect density (/cm$^2$) | | |
| | | Argon | Helium | gen (B) | SiH$_4$ | SiCl$_4$ | C$_2$H$_4$ | CCl$_4$ | | | | | |
| Sample no. | Inv. ex./ Comp. ex. | (liter/ min) | (liter/ min) | (liter/ min) | (liter/ min) | (liter/ min) | (liter/ min) | (liter/ min) | B/A (vol %) | (Si + C)/A (vol %) | Epitaxial defects | Comet defects | Stacking faults |
| 51 | Inv. ex. | | 50 | 2.5 | | | | 0.25 | 5 | 0.5 | 3.4 | 1.5 | 1.5 |
| 52 | Inv. ex. | | 50 | 2.5 | | | | 0.5 | 5 | 1.0 | 3.5 | 1.7 | 1.2 |
| 53 | Inv. ex. | | 50 | 0.5 | | | | 0.05 | 1 | 0.1 | 3.2 | 1.5 | 1.5 |
| 54 | Inv. ex. | | 50 | 0.5 | | | | 0.25 | 1 | 0.5 | 3.1 | 1.5 | 1.5 |
| 55 | Inv. ex. | | 50 | 0.5 | | | | 0.5 | 1 | 1.0 | 3.3 | 1.6 | 1.6 |
| 56 | Inv. ex. | 50 | | 5 | 0.2 | | 0.2 | | 10 | 0.8 | 3.7 | 1.8 | 1.1 |
| 57 | Inv. ex. | 50 | | 0.5 | 0.05 | | | | 1 | 0.1 | 2.6 | 1.2 | 1.6 |
| 58 | Inv. ex. | 50 | | 0.5 | 0.25 | | | | 1 | 0.5 | 2.6 | 1.1 | 1.5 |
| 59 | Inv. ex. | 50 | | 0.5 | 0.5 | | | | 1 | 1.0 | 2.5 | 1 | 1.2 |
| 60 | Inv. ex. | 50 | | 2.5 | 0.2 | | 0.2 | | 5 | 0.8 | 3.6 | 1.8 | 1.3 |
| 61 | Inv. ex. | 50 | | 0.5 | 0.2 | | 0.2 | | 1 | 0.8 | 3.6 | 1.6 | 1.6 |
| 62 | Inv. ex. | 50 | | 5 | | | 0.05 | | 10 | 0.1 | 2.5 | 1.2 | 1.1 |
| 63 | Inv. ex. | 50 | | 5 | | | 0.25 | | 10 | 0.5 | 2.5 | 1.3 | 0.9 |
| 64 | Inv. ex. | 50 | | 5 | | | 0.5 | | 10 | 1.0 | 2.8 | 1.4 | 0.9 |
| 65 | Inv. ex. | 50 | | 2.5 | | | 0.05 | | 5 | 0.1 | 2.7 | 1.3 | 1.3 |
| 66 | Inv. ex. | 50 | | 2.5 | | | 0.25 | | 5 | 0.5 | 2.6 | 1.2 | 1.1 |
| 67 | Inv. ex. | 50 | | 2.5 | | | 0.5 | | 5 | 1.0 | 2.4 | 1.2 | 1.1 |
| 68 | Inv. ex. | 50 | | 0.5 | | | 0.05 | | 1 | 0.1 | 2.6 | 1 | 1.5 |
| 69 | Inv. ex. | 50 | | 0.5 | | | 0.25 | | 1 | 0.5 | 2.3 | 1.1 | 1.3 |
| 70 | Inv. ex. | 50 | | 0.5 | | | 0.5 | | 1 | 1.0 | 2.4 | 1.1 | 1.2 |
| 71 | Inv. ex. | 50 | | 5 | | 0.05 | | | 10 | 0.1 | 2.8 | 1.4 | 1.1 |
| 72 | Inv. ex. | 50 | | 5 | | 0.25 | | | 10 | 0.5 | 2.8 | 1.5 | 1.1 |
| 73 | Inv. ex. | 50 | | 5 | | 0.5 | | | 10 | 1.0 | 2.9 | 1.5 | 1 |
| 74 | Inv. ex. | 50 | | 2.5 | | 0.05 | | | 5 | 0.1 | 2.4 | 1.1 | 1.4 |
| 75 | Inv. ex. | 50 | | 2.5 | | 0.25 | | | 5 | 0.5 | 2.6 | 1.3 | 1.2 |

TABLE 4

| | | Pre-growth atmosphere gas components | | | | | | | | | | |
|---|---|---|---|---|---|---|---|---|---|---|---|---|
| | | Inert gas (A) | | Hydro- | Material gas (Si) | | Material gas (C) | | | | Defect density (/cm²) | | |
| | | Argon | Helium | gen (B) | SiH₄ | SiCl₄ | C₂H₄ | CCl₄ | | | | | |
| Sample no. | Inv. ex./ Comp. ex. | (liter/ min) | (liter/ min) | (liter/ min) | (liter/ min) | (liter/ min) | (liter/ min) | (liter/ min) | B/A (vol %) | (Si + C)/A (vol %) | Epitaxial defects | Comet defects | Stacking faults |
| 76 | Inv. ex. | 50 | | 2.5 | 0.5 | | | | 5 | 1.0 | 2.6 | 1.2 | 1.3 |
| 77 | Inv. ex. | 50 | | 0.5 | 0.05 | | | | 1 | 0.1 | 2.5 | 1.3 | 1.6 |
| 78 | Inv. ex. | 50 | | 0.5 | 0.25 | | | | 1 | 0.5 | 2.4 | 1.1 | 1.5 |
| 79 | Inv. ex. | 50 | | 0.5 | 0.5 | | | | 1 | 1.0 | 2.4 | 1.1 | 1.5 |
| 80 | Inv. ex. | | 50 | 2.5 | | | | | 5 | 0.0 | 2.4 | 1.1 | 2.7 |
| 81 | Inv. ex. | 50 | | 2.5 | | | | | 5 | 0.0 | 2.4 | 1.1 | 2.6 |
| 82 | Comp. ex. | 50 | | | | | | | 0 | 0.0 | 1.5 | 0.8 | 4.5 |
| 83 | Comp. ex. | | 50 | | | | | | 0 | 0.0 | 1.6 | 0.9 | 4.8 |
| 84 | Comp. ex. | | | 150 | | | | | — | — | 9 | 6 | 0.7 |
| 85 | Comp. ex. | 50 | | 10 | | | | | 20 | 0.0 | 6.5 | 4 | 0.8 |
| 86 | Comp. ex. | 50 | | | 1 | | | | 0 | 2.0 | 7.8 | 4.5 | 3.2 |
| 87 | Comp. ex. | 50 | | | | 1 | | | 0 | 2.0 | 8.5 | 4 | 2.8 |
| 88 | Comp. ex. | | 50 | 10 | | | | | 20 | 0.0 | 7 | 5.5 | 0.9 |
| 89 | Comp. ex. | | 50 | | 1 | | | | 0 | 2.0 | 8.8 | 5.8 | 3.5 |
| 90 | Comp. ex. | | 50 | | | 1 | | | 0 | 2.0 | 8.5 | 4.3 | 3.6 |
| 91 | Comp. ex. | 50 | | | | | 1 | | 0 | 2.0 | 8.5 | 4.3 | 3.5 |
| 92 | Comp. ex. | 50 | | | | | | 1 | 0 | 2.0 | 8.9 | 4.6 | 3.4 |
| 93 | Comp. ex. | | 50 | | | | 1 | | 0 | 2.0 | 8.3 | 4.7 | 3.7 |
| 94 | Comp. ex. | | 50 | | | | | 1 | 0 | 2.0 | 8.6 | 5.1 | 3.6 |

INDUSTRIAL APPLICABILITY

According to this invention, in epitaxial growth of SiC on an SiC monocrystalline substrate, it is possible to reduce epitaxial defects, in particular comet defects, and possible to fabricate epitaxial SiC wafers having high quality epitaxial films reduced in stacking faults. For this reason, if forming electronic devices on such a substrate, improvement of the properties and yield of the devices can be expected.

The invention claimed is:

1. A method for producing an epitaxial silicon carbide wafer comprising epitaxially growing silicon carbide on a silicon carbide monocrystalline substrate in a growth furnace by thermal CVD,
   in which method for producing an epitaxial silicon carbide wafer, a pre-growth atmosphere gas flowing into the growth furnace before the start of epitaxial growth contains hydrogen gas and has a balance of an inert gas and unavoidable impurities, and said hydrogen gas is contained in 0.1 to 10.0 vol % with respect to the inert gas,
   wherein said pre-growth atmosphere gas further contains at least one of a silane-based gas or hydrocarbon-based gas in a total of 0.1 to 1.0 vol % with respect to said inert gas.

2. A method for producing an epitaxial silicon carbide wafer comprising epitaxially growing silicon carbide on a silicon carbide monocrystalline substrate in a growth furnace by thermal CVD,
   in which method for producing an epitaxial silicon carbide wafer, a pre-growth atmosphere gas flowing into the growth furnace before the start of epitaxial growth contains hydrogen gas and has a balance of an inert gas and unavoidable impurities, and said hydrogen gas is contained in 0.1 to 10.0 vol % with respect to the inert gas,
   wherein said pre-growth atmosphere gas further contains at least one type of gas of a silicon chloride-based gas, chlorinated hydrocarbon gas, and carbon tetrachloride gas in a total of 0.1 to 1.0 vol % with respect to said inert gas.

3. The method for producing an epitaxial silicon carbide wafer according to claim 1,
   wherein said inert gas is an argon gas or helium gas.

4. The method for producing an epitaxial silicon carbide wafer according to claim 1,
   wherein said silane-based gas is comprised of a compound expressed by $Si_xH_y$ (x, y are integers of 1 or more).

5. The method for producing an epitaxial silicon carbide wafer according to claim 1,
   wherein said hydrocarbon-based gas is comprised of a compound expressed by $C_xH_y$ (x, y are integers of 1 or more).

6. The method for producing an epitaxial silicon carbide wafer according to claim 2,
   wherein said silicon chloride-based gas is comprised of a compound expressed by $Si_xH_yCl_z$ (where, x, z are integers of 1 or more and y is an integer of 0 or more).

7. The method for producing an epitaxial silicon carbide wafer according to claim 2,
   wherein said chlorinated hydrocarbon gas is comprised of a compound expressed by $C_xH_yCl_z$ (where, x, y, z are integers of 1 or more).

8. The method for producing an epitaxial silicon carbide wafer according to claim 1,
   wherein said pre-growth atmosphere gas further contains at least one type of gas of a silicon chloride-based gas, chlorinated hydrocarbon gas, and carbon tetrachloride gas in a total of 0.1 to 1.0 vol % with respect to said inert gas.

9. The method for producing an epitaxial silicon carbide wafer according to claim 1,
   wherein said silicon carbide monocrystalline substrate has an off-angle of an angle slanted in a <11-20>direction with respect to a (0001) plane of 4° or less.

10. The method for producing an epitaxial silicon carbide wafer according to claim 2, wherein said silicon carbide monocrystalline substrate has an off-angle of an angle slanted in a <11-20>direction with respect to a (0001) plane of 4° or less.

11. The method for producing an epitaxial silicon carbide wafer according to claim 3,
wherein said silicon carbide monocrystalline substrate has an off-angle of an angle slanted in a <11-20>direction with respect to a (0001) plane of 4° or less.

12. The method for producing an epitaxial silicon carbide wafer according to claim 4,
wherein said silicon carbide monocrystalline substrate has an off-angle of an angle slanted in a <11-20>direction with respect to a (0001) plane of 4° or less.

13. The method for producing an epitaxial silicon carbide wafer according to claim 5,
wherein said silicon carbide monocrystalline substrate has an off-angle of an angle slanted in a <11-20>direction with respect to a (0001) plane of 4° or less.

14. The method for producing an epitaxial silicon carbide wafer according to claim 6,
wherein said silicon carbide monocrystalline substrate has an off-angle of an angle slanted in a <11-20>direction with respect to a (0001) plane of 4° or less.

15. The method for producing an epitaxial silicon carbide wafer according to claim 7,
wherein said silicon carbide monocrystalline substrate has an off-angle of an angle slanted in a <11-20>direction with respect to a (0001) plane of 4° or less.

16. The method for producing an epitaxial silicon carbide wafer according to claim 1 comprising epitaxially growing silicon carbon by thermal CVD of an induction heating system using a graphite growth furnace.

17. The method for producing an epitaxial silicon carbide wafer according to claim 2 comprising epitaxially growing silicon carbon by thermal CVD of an induction heating system using a graphite growth furnace.

18. The method for producing an epitaxial silicon carbide wafer according to claim 2,
wherein said inert gas is an argon gas or helium gas.

* * * * *